(12) United States Patent
Kobayashi

(10) Patent No.: US 8,665,022 B2
(45) Date of Patent: Mar. 4, 2014

(54) LOW NOISE-LINEAR POWER DISTRIBUTED AMPLIFIER

(75) Inventor: Kevin W. Kobayashi, Torrance, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 78 days.

(21) Appl. No.: 13/457,536

(22) Filed: Apr. 27, 2012

(65) Prior Publication Data

US 2012/0274406 A1 Nov. 1, 2012

Related U.S. Application Data

(60) Provisional application No. 61/480,106, filed on Apr. 28, 2011.

(51) Int. Cl.
*H03F 3/60* (2006.01)

(52) U.S. Cl.
USPC .............................. 330/266; 330/310; 330/54

(58) Field of Classification Search
USPC ............ 330/286, 53–54, 66, 124 R, 295, 310
See application file for complete search history.

(56) References Cited

U.S. PATENT DOCUMENTS

| | | | |
|---|---|---|---|
| 4,540,954 A | 9/1985 | Apel | |
| 4,543,535 A | 9/1985 | Ayasli | |
| 4,752,746 A | 6/1988 | Niclas | |
| 4,788,511 A | 11/1988 | Schindler | |
| 5,028,879 A | 7/1991 | Kim | |
| 5,046,155 A | 9/1991 | Beyer et al. | |
| 5,208,547 A | 5/1993 | Schindler | |
| 5,227,734 A | 7/1993 | Schindler et al. | |
| 5,361,038 A | 11/1994 | Allen et al. | |
| 5,365,197 A | 11/1994 | Ikalainen | |
| 5,378,999 A | 1/1995 | Martens et al. | |
| 5,414,387 A | 5/1995 | Nakahara et al. | |
| 5,485,118 A | 1/1996 | Chick | |
| 5,880,640 A | 3/1999 | Dueme | |
| 6,049,250 A | 4/2000 | Kintis et al. | |
| 6,342,815 B1 | 1/2002 | Kobayashi | |
| 6,377,125 B1 | 4/2002 | Pavio et al. | |
| 6,400,226 B2 | 6/2002 | Sato | |
| 6,727,762 B1 | 4/2004 | Kobayashi | |
| 6,759,907 B2 | 7/2004 | Orr et al. | |
| 6,943,631 B2 | 9/2005 | Scherrer et al. | |

(Continued)

OTHER PUBLICATIONS

Non-final Office Action for U.S. Appl. No. 13/154,910 mailed Oct. 1, 2012, 7 pages.

(Continued)

*Primary Examiner* — Hieu Nguyen
(74) *Attorney, Agent, or Firm* — Withrow & Terranova, P.L.L.C.

(57) ABSTRACT

The present disclosure describes a distributed amplifier (DA) that includes active device cells within sections that are configured to provide an input gate termination that is conducive for relatively low noise and high linearity operation. A section adjacent to an output of the DA is configured to effectively terminate the impedance of an input transmission line of the DA. Each active device cell includes transistors coupled in a cascode configuration that thermally distributes a junction temperature among the transistors. In this manner, noise generated by a common source transistor of the cascode configuration is minimized. The transistors coupled in the cascode configuration may be fabricated using gallium nitride (GaN) technology to reduce physical size of the DA and to further reduce noise.

28 Claims, 9 Drawing Sheets

(56) References Cited

U.S. PATENT DOCUMENTS

| | | | |
|---|---|---|---|
| 7,482,874 B2 | 1/2009 | Heydari et al. | |
| 7,804,262 B2 | 9/2010 | Schuster et al. | |
| 7,804,362 B2 * | 9/2010 | Nguyen | 330/286 |
| 7,924,097 B2 | 4/2011 | Lender, Jr. et al. | |
| 2003/0184383 A1 | 10/2003 | Ogawa | |

OTHER PUBLICATIONS

Kobayashi, K.W. et al., "Extending the Bandwidth Performance of Heterojunction Bipolar Transistor-based Distributed Amplifiers," IEEE Transactions on Microwave Theory and Techniques, vol. 44, No. 5, May 1996, pp. 739-748.

Robertson, I.D. et al., "Ultrawideband biasing of MMIC distributed amplifiers using improved active load," Electronics Letters, vol. 27, Oct. 10, 1991, pp. 1907-1909.

Ayasli, Yalcin et al., "Capacitively Coupled Traveling-Wave Power Amplifier," IEEE Transactions on Electron Devices, Dec. 1984, pp. 1937-1942, vol. ED-31, No. 12, IEEE.

Ayasli, Yalcin et al., "Monolithic 2-20 GHz GaAs Travelling-Wave Amplifier," Electronic Letters, Jul. 8, 1982, pp. 596-598, vol. 18, IEEE.

Ayasli, Yalcin et al., "Monolithic GaAs Travelling-Wave Amplifier," Electronic Letters, Jun. 11, 1981, pp. 413-414, vol. 17, No. 12, IEEE.

Ayasli, Yalcin et al., "A Monolithic GaAs 1-13-GHz Traveling-Wave Amplifier," IEEE Transactions on Electron Devices, Jul. 1982, pp. 1072-1177, vol. 29, No. 7, IEEE.

Ayasli, Yalcin et al., "2-20-GHz GaAs Traveling-Wave Power Amplifier," IEEE Transactions on Microwave Theory and Techniques, Mar. 1984, pp. 290-295, IEEE.

Ayasli, Yalcin et al., "2-20-Ghz GaAs Traveling-Wave Amplifier," IEEE Transactions on Microwave Theory and Techniques, Jan. 1984, pp. 71-77, vol. 32, No. 1, IEEE.

Campbell, Charles et al., "A Wideband Power Amplifier MMIC Utilizing GaN on SiC HEMT Technology," IEEE Journal of Solid-State Circuits, Oct. 2009, pp. 2640-2647, vol. 44, No. 10, IEEE.

Duperrier, Cedric et al, "New Design Method of Non-Uniform Distributed Power Amplifiers. Application to a single stage 1 W PHEMT MMIC," 2001 IEEE MTT-S International Microwave Symposium Digest, 2001, pp. 1063-1066, vol. 12, IEEE.

Duperrier, Cedric et al., "New Design Method of Uniform and Non-uniform Distributed Power Amplifiers," IEEE Transactions on Microwave Theory and Techniques, Dec. 2001, pp. 2494-2500, vol. 29, No. 12, IEEE.

Fraysse, J.P. et al, "A 2W high efficiency 2-8GHz cascode HBT MMIC power distributed amplifier," IEEE MTTS Digest, Jun. 2000, pp. 529-532, vol. 1, IEEE.

Gassmann, J. et al., "Wideband, High-Efficiency GaN Power Amplifiers Utilizing a Non-Uniform Distributed Topology," IEEE/MTT-S International Microwave Symposium, Jun. 2007, pp. 615-618, IEEE.

Green, Bruce et al, "Cascode Connected AlGaN/GaN HEMT's on SiC Substrates," IEEE Microwave and Guided Wave Letters, Aug. 2000, pp. 316-318, vol. 10, No. 8, IEEE.

Green, Bruce M. et al., "High-Power Broad-Band AlGaN/GaN HEMT MMICs on SiC Substrates," IEEE Transactions on Microwave Theory and Techniques, Dec. 2001, pp. 2486-2493, vol. 49, No. 12, IEEE.

Martin, A. et al., "Design of GaN-based Balanced Cascode Cells for Wide-band Distributed Power Amplifier," 2007 EuMIC Microwave Integrated Circuit Conference, Oct. 8-10, 2007, pp. 154-157, IEEE.

Meharry, David E. et al., "Multi-Watt Wideband MMICs in GaN and GaAs," IEEE/MTT-S International Microwave Symposium, Jun. 2007, pp. 631-634, IEEE.

Shifrin, M. et al., "A New Power Amplifier Topology With Series Biasing and Power Combining of Transistors," Microwave and Millimeter-Wave Monolithic Circuits Symposium, Jun. 1-3, 1992, pp. 39-41, IEEE.

Van Raay, F. et al., "A Coplanar X-Band AlGaN/GaN Power Amplifier MMIC on s.i. SiC Substrate," IEEE Microwave and Wireless Components Letters, Jul. 2005, pp. 460-462, vol. 15, No. 7, IEEE.

Van Raay, F. et al., "A Microstrip X-Band AlGaN/GaN Power Amplifier MMIC on s.i. SiC Substrate," EGAAS 2005 Gallium Arsenide and Other Semiconductor Application Symposium, Oct. 3-4, 2005, pp. 233-236, IEEE.

Zhao, Lei et al., "A 6 Watt LDMOS Broadband High Efficiency Distributed Power Amplifier Fabricated Using LTCC Technology," 2002 IEEE MTT-S International Microwave Symposium Digest, 2002, pp. 897-900, IEEE.

Non-final Office Action mailed Feb. 24, 2011, regarding U.S. Appl. No. 12/651,717, 11 pages.

Non-final Office Action mailed Feb. 25, 2011 regarding U.S. Appl. No. 12/651,726, 8 pages.

Notice of Allowance mailed Jun. 24, 2011 regarding U.S. Appl. No. 12/651,726, 7 pages.

Non-final Office Action for U.S. Appl. No. 13/154,910 Jan. 4, 2012, 17 pages.

Notice of Allowance for U.S. Appl. No. 13/154,910 mailed Apr. 16, 2012, 5 pages.

Notice of Allowance for U.S. Appl. No. 10/304,593 mailed Dec. 8, 2003, 6 pages.

* cited by examiner

LOW NOISE-LINEAR POWER DISTRIBUTED AMPLIFIER

RELATED APPLICATIONS

This application claims the benefit of provisional patent application Ser. No. 61/480,106, filed Apr. 28, 2011, the disclosure of which is hereby incorporated herein by reference in its entirety. This patent application is also related to U.S. Pat. No. 6,727,762 entitled "DIRECT COUPLED DISTRIBUTED AMPLIFIER; provisional patent application Ser. No. 61/142,283 entitled CAPACITIVELY-COUPLED, NON-UNIFORMLY DISTRIBUTED POWER AMPLIFIER WITH BASEBAND PERFORMANCE, filed Jan. 2, 2009; patent application Ser. No. 12/651,717 entitled CAPACITIVELY-COUPLED DISTRIBUTED AMPLIFIER WITH BASEBAND PERFORMANCE, filed Jan. 4, 2010, now U.S. Pat. No. 8,035,449; patent application Ser. No. 13/154,910 entitled CAPACITIVELY-COUPLED DISTRIBUTED AMPLIFIER WITH BASEBAND PERFORMANCE, filed Jun. 7, 2011, now U.S. Pat. No. 8,451,059; and U.S. Pat. No. 8,058,930 entitled CAPACITIVELY-COUPLED NON-UNIFORMLY DISTRIBUTED AMPLIFIER, filed Jan. 4, 2010; the disclosures of which are incorporated herein by reference in their entireties.

FIELD OF THE DISCLOSURE

Embodiments of the present disclosure relate to distributed amplifiers which may be used in radio frequency (RF) communications systems, optical fiber based communication systems, baseband frequency communications systems, or any combination thereof.

BACKGROUND

Several different amplifier applications require an amplifier having a large gain-bandwidth product. For example, RF signals on optical fibers may require large gain-bandwidth product amplifiers that are highly linear. Some broadband fiber and RF communications applications may require large gain-bandwidth product amplifiers to provide high spectral efficiency. Software configurable communications systems may require an amplifier having a large gain-bandwidth product and a very wide operating bandwidth, which may span baseband frequencies to microwave frequencies. Baseband to microwave instrumentation may require an amplifier having a large gain-bandwidth product and a very wide operating bandwidth.

Distributed amplifiers (DAs) typically utilize multiple transconductance elements coupled together to provide an amplifier having a larger gain-bandwidth product than is possible with an amplifier using a single comparable transconductance element. A DA may have an input line of inductive elements or transmission line sections coupled in series and a parallel output line of inductive elements or transmission line sections coupled in series. The input and the output lines have corresponding taps that are coupled to the multiple transconductance elements, such that an input signal, which is applied to one end of the input line, propagates down the input line. As the input signal propagates down the input line, each successive transconductance element receives and amplifies the input signal to feed a corresponding tap into the output line. Each successive transconductance element adds to the amplified input signal. As such, the amplified input signal propagates down the output line to provide an output signal at the end of the output line. Ideally, the input line and the output line have identical delays, such that the input signal and the amplified input signal stay in phase with one another so that each transconductance element adds to the amplified input signal in phase. However, practical DAs may have phase velocity variations, distortions, or both along the output line that may degrade the linearity of the DA, the efficiency of the DA, or both.

Capacitively-coupled DAs may be used to extend gain-bandwidth products of the DAs. However, capacitive-coupling limits baseband operation of the DAs. Thus, there is a need for a DA having a large gain-bandwidth product along with a very wide operating bandwidth that allows for baseband amplification.

SUMMARY

The present disclosure relates to a distributed amplifier (DA) having a plurality of amplifier sections, such that each of the plurality of amplifier sections has an input gate and an output drain including a first plurality of inductive elements coupled in series between a DA input and a first output to form a first plurality of connection nodes. Each of the first plurality of connection nodes is coupled to a corresponding adjacent pair of the first plurality of inductive elements. A second plurality of inductive elements is coupled in series between a first input and a DA output to form a second plurality of connection nodes. In this manner, each of the second plurality of connection nodes is coupled to a corresponding adjacent pair of the second plurality of inductive elements and to a corresponding output drain of the plurality of amplifier sections. Respective ones of the first plurality of connection nodes are directly connected only to corresponding ones of the first plurality of inductive elements. Moreover, corresponding input gate and respective ones of the second plurality of connection nodes are directly connected only to corresponding ones of the second plurality of inductive elements and the corresponding output drain. Further still, the DA input is adapted to receive a first input signal and the DA output is adapted to provide a first output signal based on amplifying the first input signal. An active impedance termination circuit having a termination input is coupled to the first output and a termination output is coupled to one of the second plurality of connection nodes adjacent to the DA output.

Further still, active device cells within sections of the DA are configured to provide an input gate termination that is conducive for relatively low noise and high linearity operation. A section adjacent to the output of the DA is configured to effectively terminate the impedance of an input transmission line of the DA. Each active device cell includes transistors coupled in a cascode configuration that thermally distributes a junction temperature among the transistors. In this manner, noise generated in a common source transistor of the cascode configuration is minimized.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
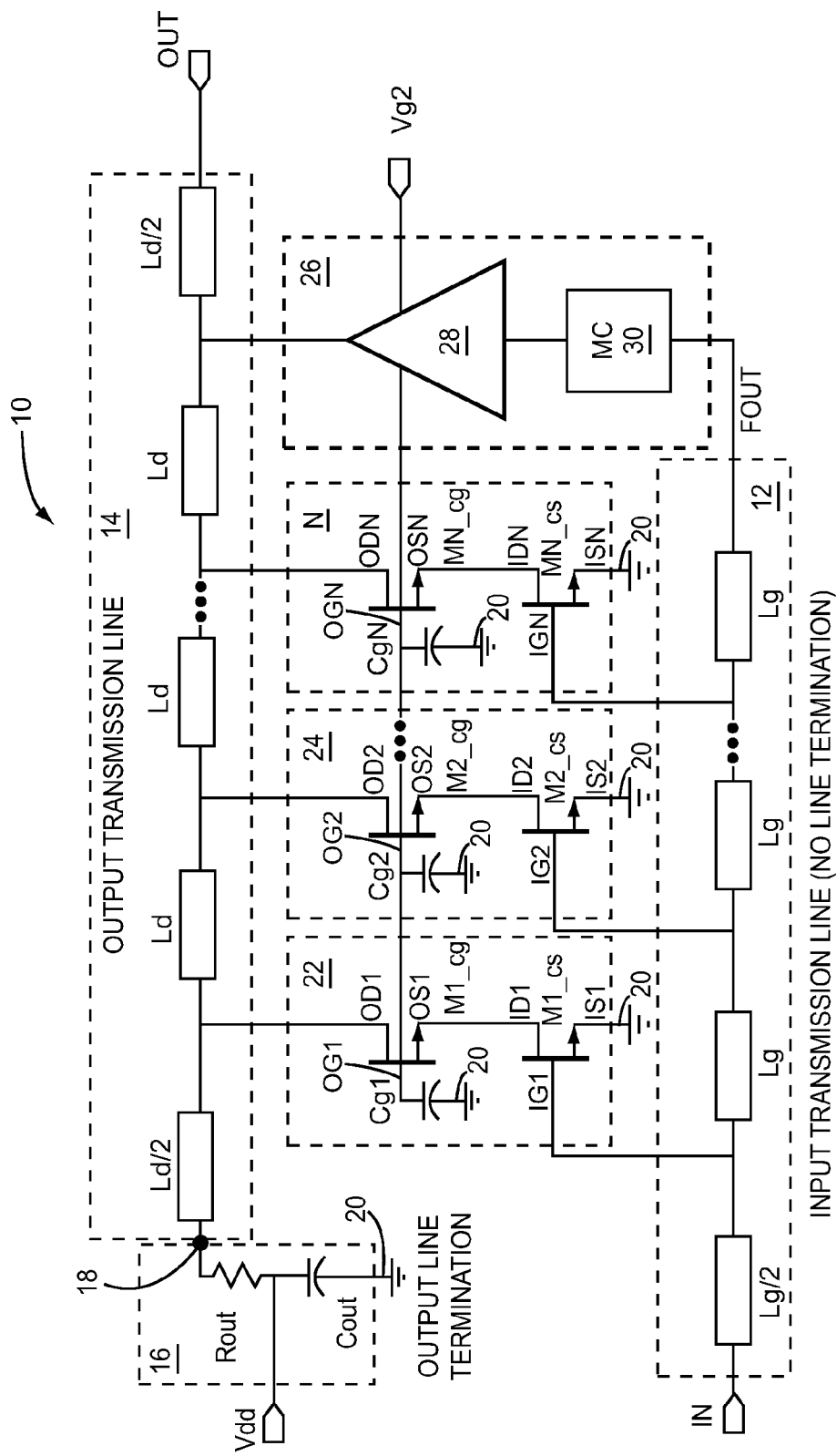
FIG. 1 is a schematic of one embodiment of a distributed amplifier (DA) that is in accordance with the present disclosure.

FIG. 1 is a schematic of one embodiment of a distributed amplifier (DA) 10 that is in accordance with the present disclosure. The DA 10 includes DA input IN coupled to an input transmission line having a first group of inductive elements 12 with relative inductance values of Lg and Lg/2. The DA 10 also has a first output FOUT at the end of the input transmission line. The DA 10 is adapted to receive a first input signal that is a baseband signal that has a frequency of less than about 30 kHz. The DA 10 is also configured to receive a radio frequency (RF) input signal that is greater than about 30 GHz. The DA 10 also includes a DA output OUT coupled to an output transmission line having a second group of inductive elements 14 with relative inductance values of Ld and Ld/2. An optional output terminal network 16 is made up of an output resistor Rout and an output capacitor Cout that are coupled in series between a first input 18 and a common node 20. A voltage source Vdd for supplying power to the DA 10 is coupled between the output resistor Rout and the output capacitor Cout.

A plurality of amplifier sections 22, 24, and N can be made up of transconductance cells that are configured as cascode devices that generate relatively low amounts of noise while producing relatively high amounts of linear power in comparison to a common source transistor configuration alone. In this case, a first cascode device configuration includes a first common gate transistor M1_cg and a first common source transistor M1_cs. The first common gate transistor M1_cg has an output gate OG1 coupled to the common node 20 by a gate capacitor Cg1, while the first common source transistor M1_cs has an input drain ID1 coupled to an output source OS1 of the first common gate transistor M1_cg and an input source IS1 coupled directly to the common node 20. The output gate OG1 of first common gate transistor M1_cg is also coupled to a common gate direct current (DC) supply (Vg2).

Similarly, a second cascode device configuration includes a second common gate transistor M2_cg and a second common source transistor M2_cs. The second common gate transistor M2_cg has an output gate OG2 coupled to the common node 20 by a gate capacitor Cg2, while the second common source transistor M2_cs has an input drain ID2 coupled to an output source OS2 of the second common gate transistor M2_cg and an input source IS2 coupled directly to the common node 20. The output gate OG2 of second common gate transistor M2_cg is also coupled to the common gate DC supply (Vg2).

Likewise, an Nth cascode device configuration includes an Nth common gate transistor MN_cg and an Nth common source transistor MN_cs. The Nth common gate transistor MN_cg has an output gate OGN coupled to the common node 20 by a gate capacitor CgN, while the Nth common source transistor MN_cs has an input drain IDN coupled to an output source of the Nth common gate transistor MN_cg and an input source ISN coupled directly to the common node 20. The output gate OGN of Nth common gate transistor MN_cg is also coupled to the common gate DC supply (Vg2).

The plurality of amplifier sections 22, 24, and N may be made up of a plurality of tapered gate periphery transconductance devices such as a cascode device comprised of the first common source transistor M1_cs and the first common gate transistor M1_cg. Each of the plurality of tapered gate periphery transconductance devices comprises an input gate and an input source and has a gate-to-source capacitance between the input gate and the input source. Moreover, the gate-to-source capacitance of each of the plurality of tapered gate periphery transconductance devices increases moving from the DA input IN to the first output FOUT. In another embodiment, the gate-to-source capacitance of each of the plurality of tapered gate periphery transconductance devices decreases moving from the DA input IN to the first output FOUT. The plurality of amplifier section 22, 24, and N may comprise gallium nitride (GaN) devices to realize a GaN low noise distributed amplifier.

The first, second, and Nth cascode device configurations reduce junction heating of the first, second, and Nth common source transistors caused from self heating, while the first, second, and Nth common gate transistors allow for relatively higher voltage operation. Moreover, an output section 26 of the DA 10 includes as a low noise termination amplifier cell that may be configured as a low noise amplifier 28 that has input impedance that effectively provides a load for the input line having the first group of inductive elements 12. As a result, of the output section 26, a need for a relatively noisy input line termination resistor is eliminated. In at least one embodiment of the DA 10, the low noise amplifier 28 may be a relatively large periphery low impedance cascode stage coupled to a broadband low-loss input matching circuit (MC) 30.

Figure 2:
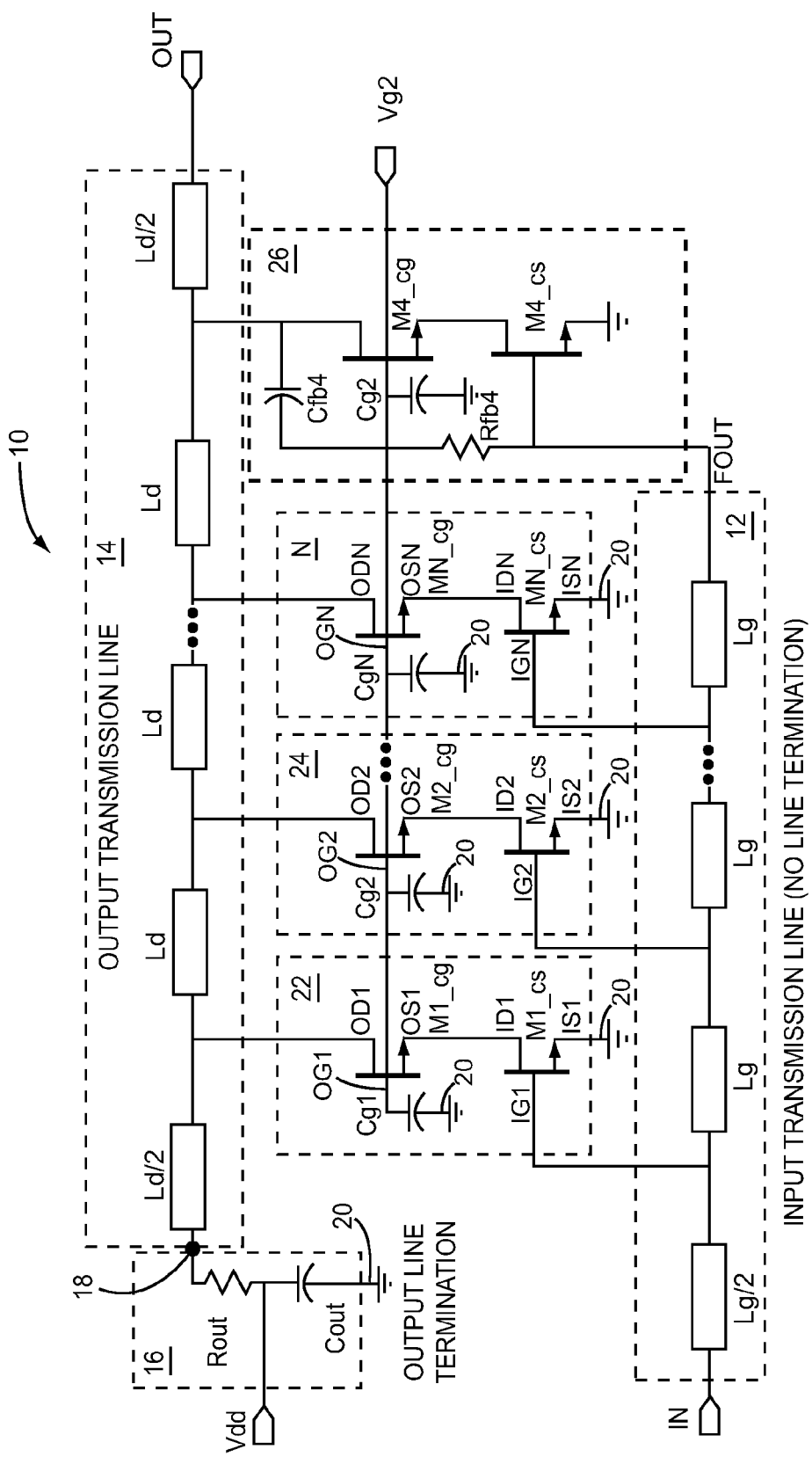
FIG. 2 is a schematic of another embodiment of the DA that has an output section configured as a cascode amplifier with localized feedback.

FIG. 2 is a schematic of another embodiment of the DA 10. FIG. 2 illustrates an additional feature of the DA 10 where the output section 26 is configured as a cascode amplifier with local feedback. The cascode amplifier is configured to have wideband input impedance which effectively provides an optimal input transmission line termination that results in wideband DA low noise figure and high linearity. It should be noted that the feedback is applied locally to the last section of the DA 10 and does not include an output commensurate transmission line Ld/2 or a section of input transmission line Lg/2, but is applied locally to the last section active cell. Further, the cascode transconductance device may comprise a large gate periphery for improving the termination of the input termination line. The use of a cascode feedback amplifier as the last section of the distributed amplifier is only representative, and may be replaced by another topological configuration of an amplifier with similar input impedance, noise, and linearity characteristics across a desired band. It should be appreciated that the configuration of the last section of the DA is not limited to the last section, but may apply to any number of sections in a manner to terminate the input transmission line in a gradual impedance transformation. This is illustrated in FIG. 3.

Figure 3:
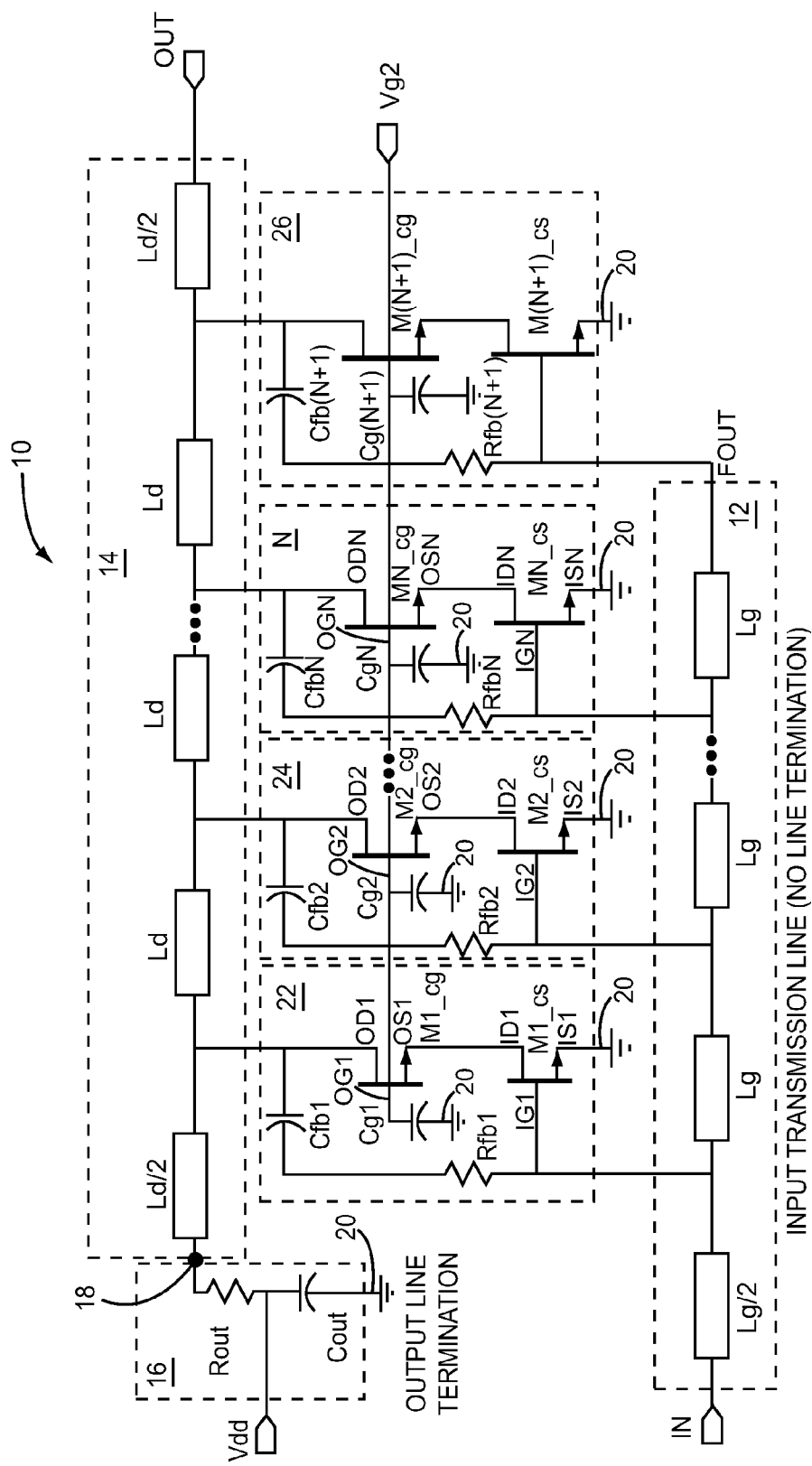
FIG. 3 is a schematic of the DA of FIG. 2 being further extended by a reconfiguration of all sections to collectively provide distributed terminating impedance for an input transmission line.

FIG. 3 further extends the embodiment of FIG. 2 by reconfiguring all the sections of the DA 10 to collectively provide a distributed terminating impedance for the input transmission line for providing wider low noise high linearity power bandwidth performance. In this embodiment, each successive section employs increasing amounts of feedback and larger device periphery to distribute the terminating impedance(s) across the different sections of the distributed amplifier. It should be noted that the cascode feedback amplifier is only representative and may be replaced by an amplifier(s) whose characteristics provide desired input impedance, noise, and linearity performance appropriate for achieving the overall objectives of providing a terminating impedance for the input transmission line which allows lower noise and no degradation of linearity compared to a resistively terminated DA. Localized feedback is provided in each amplifier section 22 through N and the output section 26 via a series resistor and capacitor coupled between the drain and the gate of each cascode device configuration. For example, a feedback resistor Rfb1 and a feedback capacitor Cfb1 provides localized feedback for amplifier section 22, whereas a feedback resistor Rfb2 and a feedback capacitor Cfb2 provides localized feedback for amplifier section 24. Similarly, a feedback resistor RfbN and a feedback capacitor CfbN provides localized feedback for amplifier section N, and a feedback resistor Rfb(N+1) and a feedback capacitor Cfb(N+1) provides localized feedback for output section 26.

Figure 4:
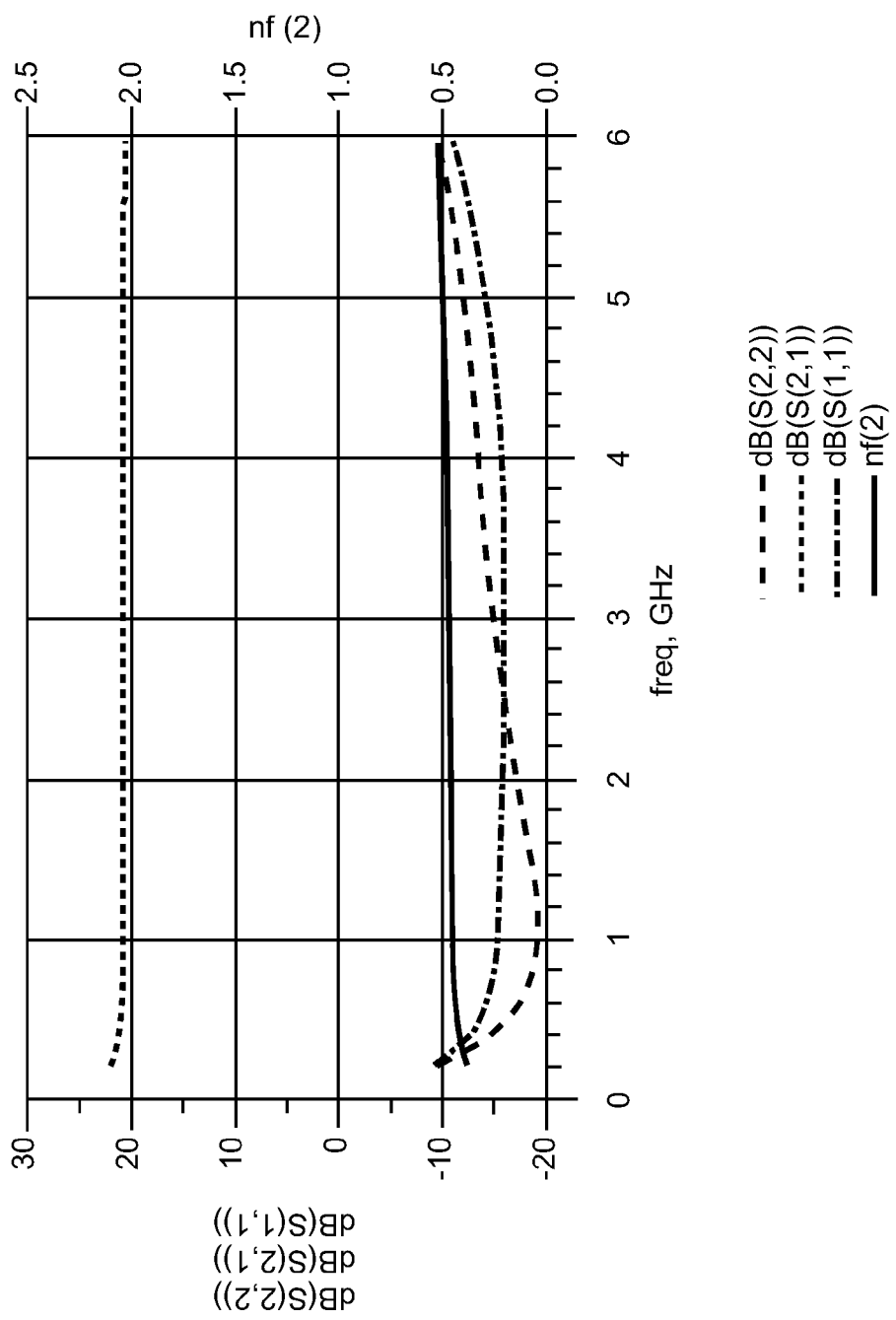
FIG. 4 is an S-parameter graph that depicts an S-parameter response of a 50 ohm input matched low noise amplifier.

FIG. 4 is an S-parameter graph that depicts an S-parameter response of a 50 ohm input matched low noise amplifier, which may represent the last section amplifier active cell of embodiment 1 of FIG. 1, and the output section 26 that includes the feedback amplifier made up of common gate transistor M(N+1)_cg and the common source transistor M(N+1)_cs (FIG. 3). The input impedance of this wideband LNA is roughly 50 ohms and terminates the input transmission line of the DA 10 in order to provide overall low noise while not compromising linear output capability. The gain of the output section 26 is flat and the noise figure is <0.5 dB with excellent return-loss. Integrated as the last section of the DA 10, the output section 26 can provide a low noise input line termination without compromising the linearity of the feedback amplifier of the output section 26 as it contributes output power in an additive manner to the output of the DA 10. In FET implementations, it may be advantageous to increase the device size in order to lower the input impedance of the amplifier so that it is easier to low noise match to 50 ohms across a broad bandwidth. Additionally, in order to preserve the noise figure under high voltage operation, a cascode may be employed in the amplifier in order to distribute the thermal self-heating in a manner which results in lower junction temperature for the primary common-source transconductance device.

Figure 5:
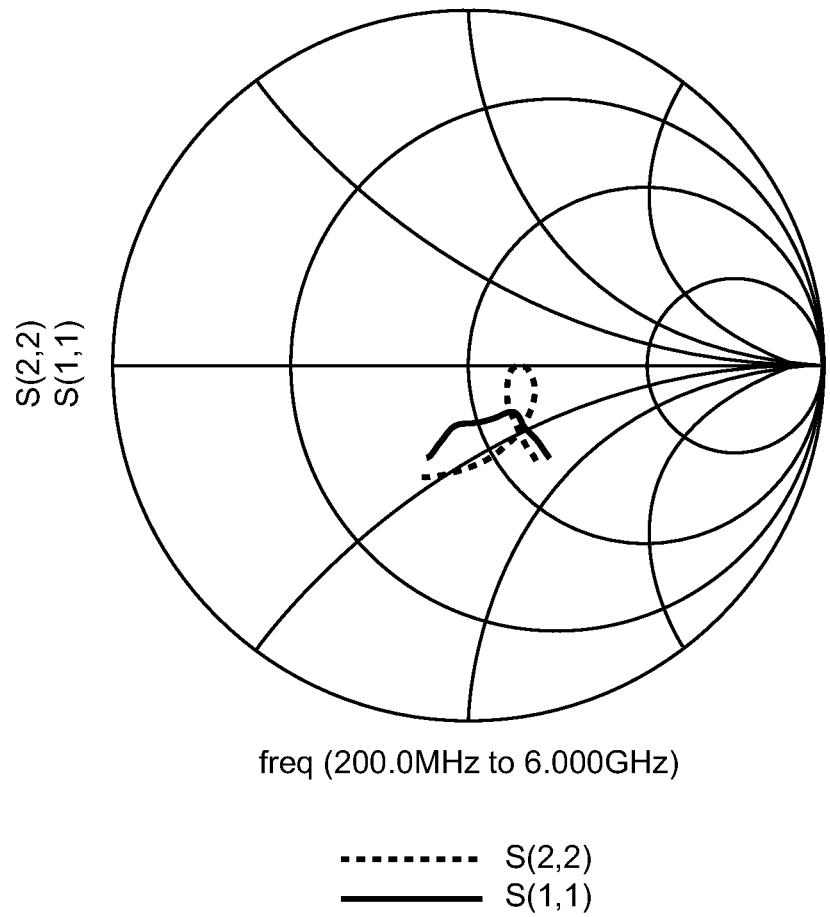
FIG. 5 is a Smith chart that shows corresponding S(1,1) and S(2,2) parameters for the last section of the low noise amplifier shown in FIGS. 1, 2, and 3.

FIG. 5 is a Smith chart that shows corresponding S(1,1) and S(2,2) parameters for the output section 26 (FIGS. 1 and 3), which shows a broadband 50 ohm input match of the amplifier 28 (FIG. 1), which effectively terminates the input transmission line, thus, eliminating a traditional noisier resistive termination. The input line termination impedance provided by the DA 10 may be distributed among multiple sections which results in a predetermined wideband DA response. In at least one embodiment, it may be desirable to taper the impedance transformation along the input line having a first group of inductive elements 12 by adjusting device periphery or by using various multiple feedback sections.

Figure 6:
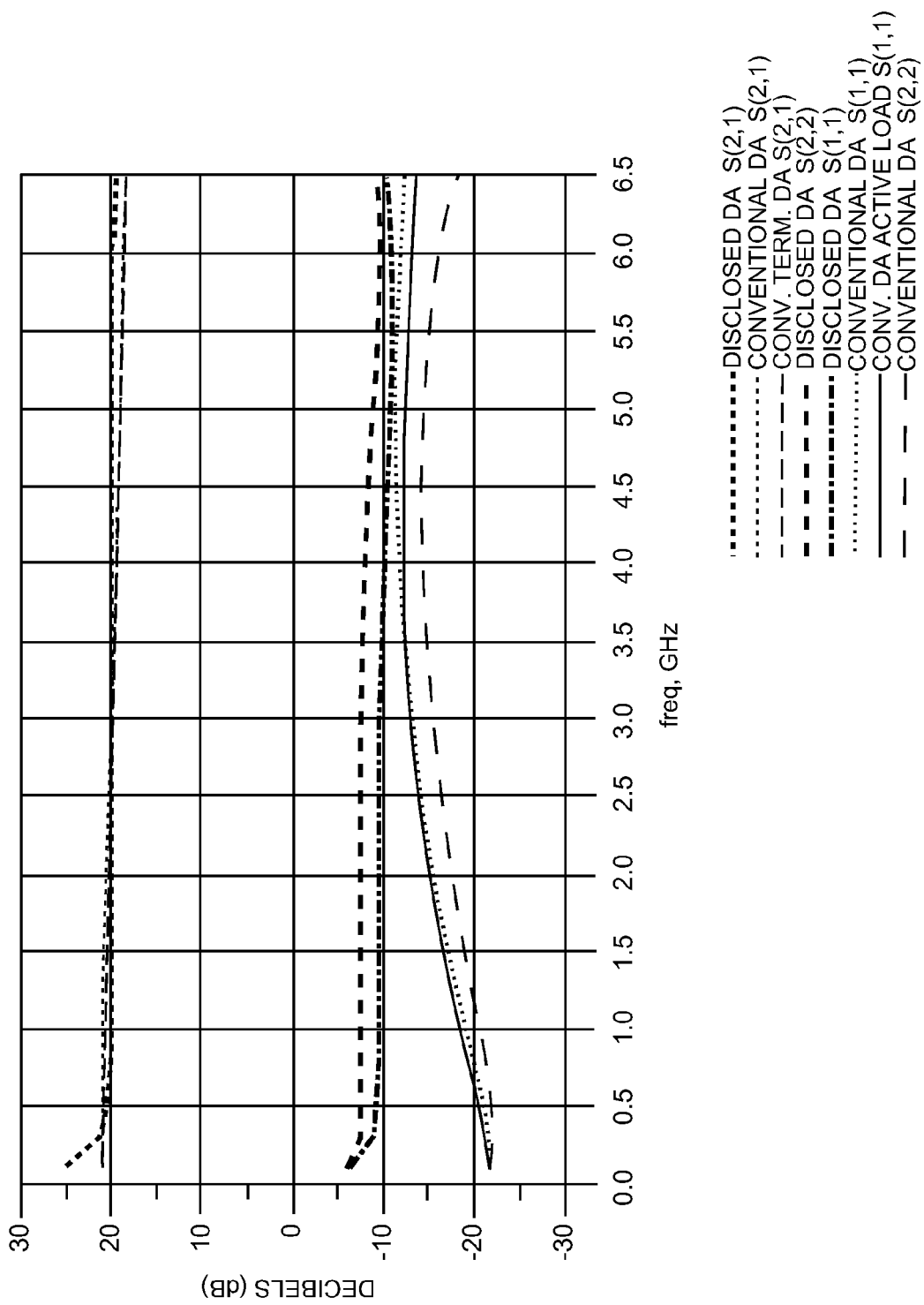
FIG. 6 is an S-parameter graph that depicts S-parameter performance comparing a conventional DA, a conventional DA with active load, and the DA of FIG. 3.

FIG. 6 is an S-parameter graph that depicts S-parameter performance comparing a conventional DA, a conventional DA with active load, and the DA 10 (FIG. 3). FIG. 6 generally shows that a conventional DA, a conventional actively loaded DA, and the DA 10 of the present disclosure can each achieve a similar wideband flat gain response with reasonably return-loss across the band. However, it should be noted that the DA 10 of FIG. 3 utilizes tapered feedback and device periphery to provide a relatively flatter wideband response. For example successive ones of the plurality of amplifier sections 22, 24, and N may comprise tapered active impedance circuits to provide a gradually tapered impedance transition. Moreover, selected ones of the plurality of amplifier sections 22, 24, and N each include increased feedback.

Figure 7:
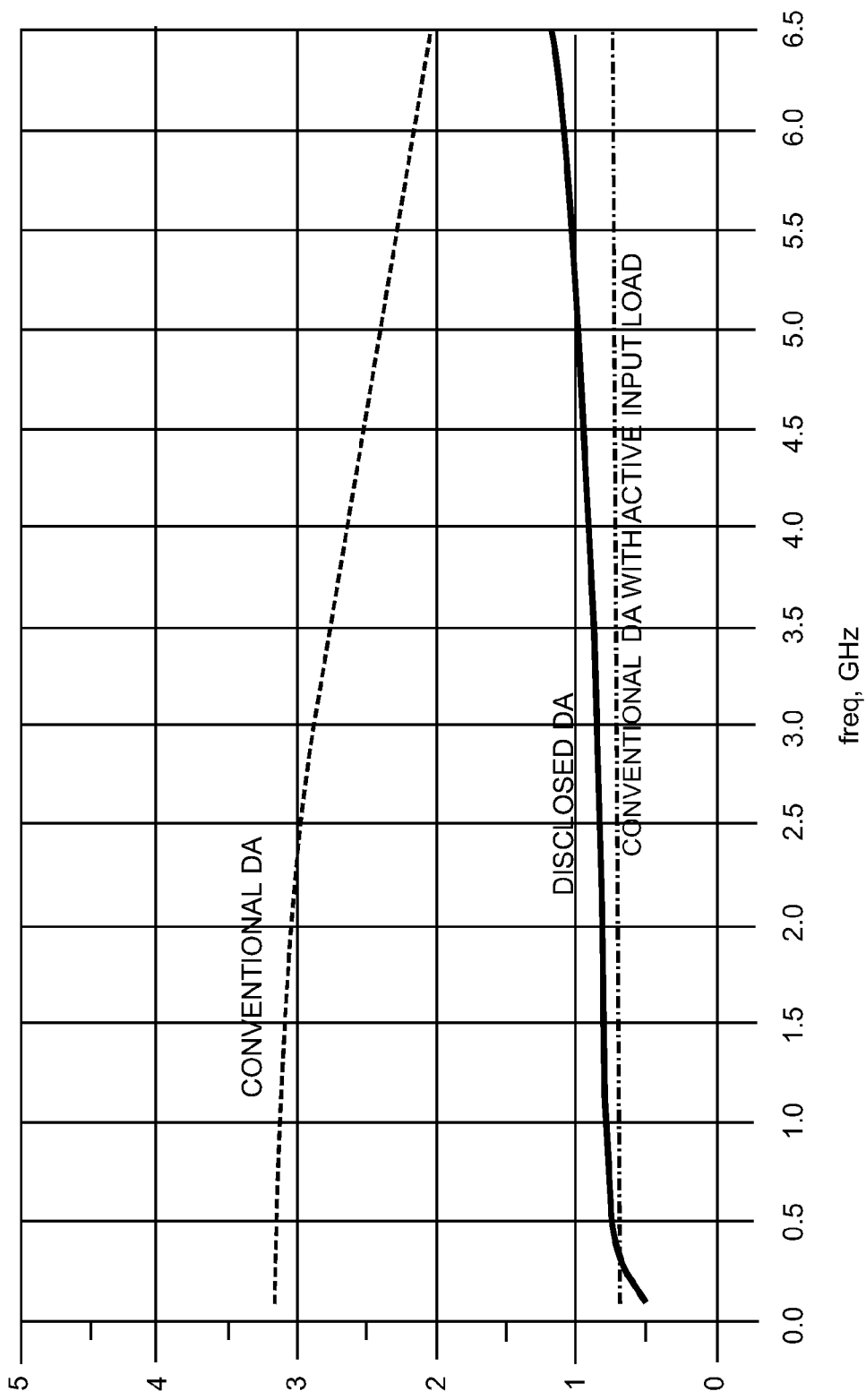
FIG. 7 is a graph that depicts noise figure (NF) performance of a conventional DA, an actively loaded conventional DA, and the DA of FIG. 3.
Figure 8:
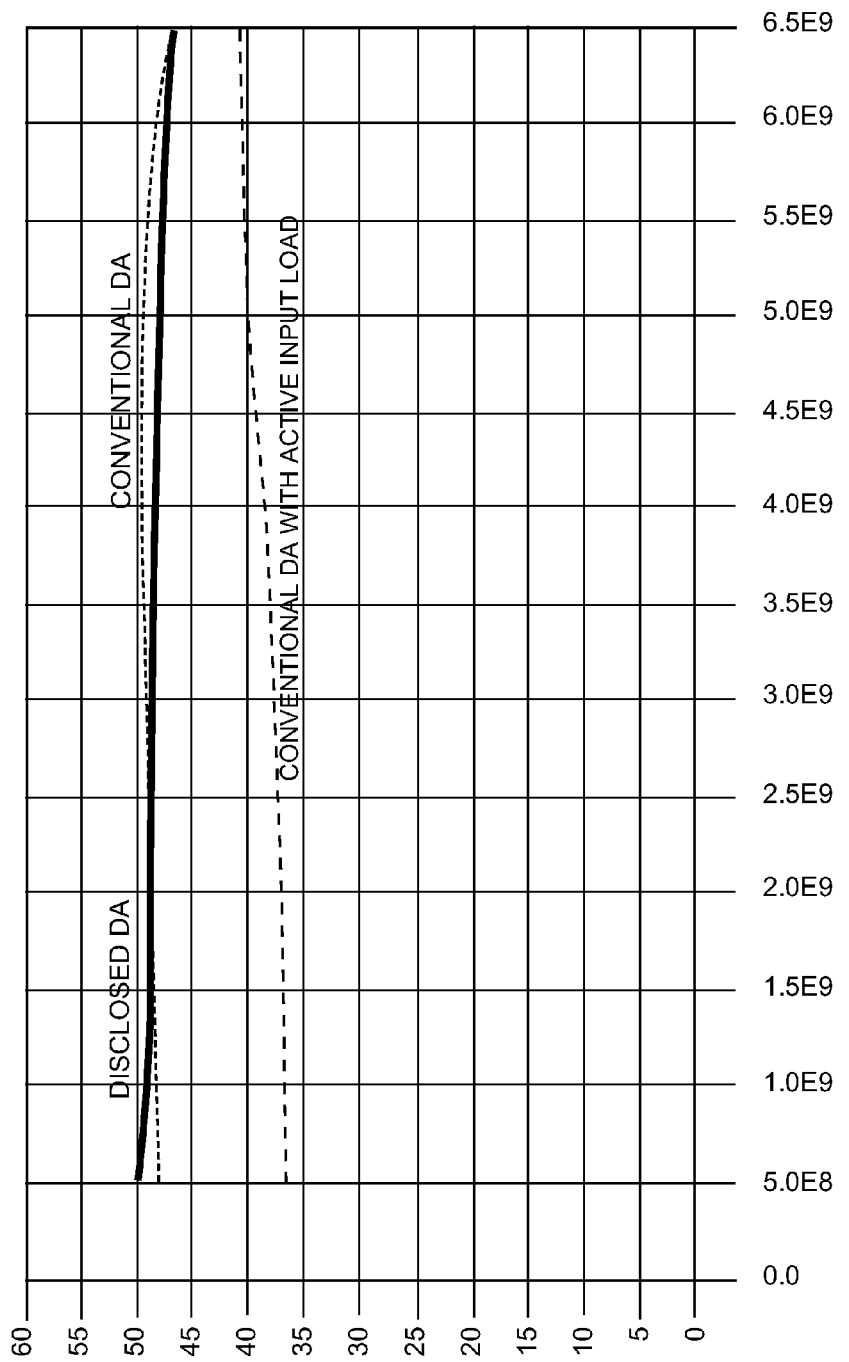
FIG. 8 is a graph of third order intercept (IP3) output, which is linearity performance of the conventional DA, an actively loaded conventional DA, and the DA of FIG. 3.

FIG. 7 is a graph that depicts noise figure (NF) performance of a conventional DA (dotted line), an actively loaded conventional DA (dashed line) and the DA 10 (FIG. 3) (solid line). As mentioned previously, the conventional DA topology can achieve high broadband power, but is typically limited to >2 dB NF due to the thermal noise contribution of a resistive termination of the input transmission line. The DA 10 (FIG. 3) with an active input transmission line load can achieve a sub-dB NF across the wideband spectrum, but as shown in FIG. 8, the NF degrades the linearity of the amplifier due to the non-linearity introduced by an active load. The DA 10 of FIG. 3 shows that similar sub-dB noise figure may be obtained across most of the wideband spectrum. While this specific exemplary design indicates a slightly higher NF than the active load, the DA 10 (FIG. 3) preserves output linearity in comparison to an active load approach.

FIG. 8 is a graph of third order intercept (IP3) output, which is linearity performance of the conventional DA (dotted line), an actively loaded conventional DA (dashed line), and the DA 10 (FIG. 3) (solid line). This comparison shows that the IP3 output of DA 10 may not significantly degrade the performance compared to the resistively terminated conventional DA approach. Further inspection of FIG. 8 illustrates that the actively terminated DA 10 does result in significant degradation of an output third order intercept point (OIP3) linearity across the wideband spectrum due to non-linearities introduced by the input active load termination. However, DA 10 has an advantage of providing both the low noise performance of the active load approach while maintaining the high linear output power of the conventional DA approach. Moreover, the use of cascode-based active cells combined with the DA approach will reduce the transistor self-heating and lower its junction temperature which enables simultaneous low noise and high linear output power under high voltage and current operation. When combined with gallium nitride high electron mobility transistor (GaN HEMT) technology, operation from baseband frequencies to microwave frequencies may be obtained with sub-dB NF and multiple watts of linear output power in a monolithic approach.

Figure 9:
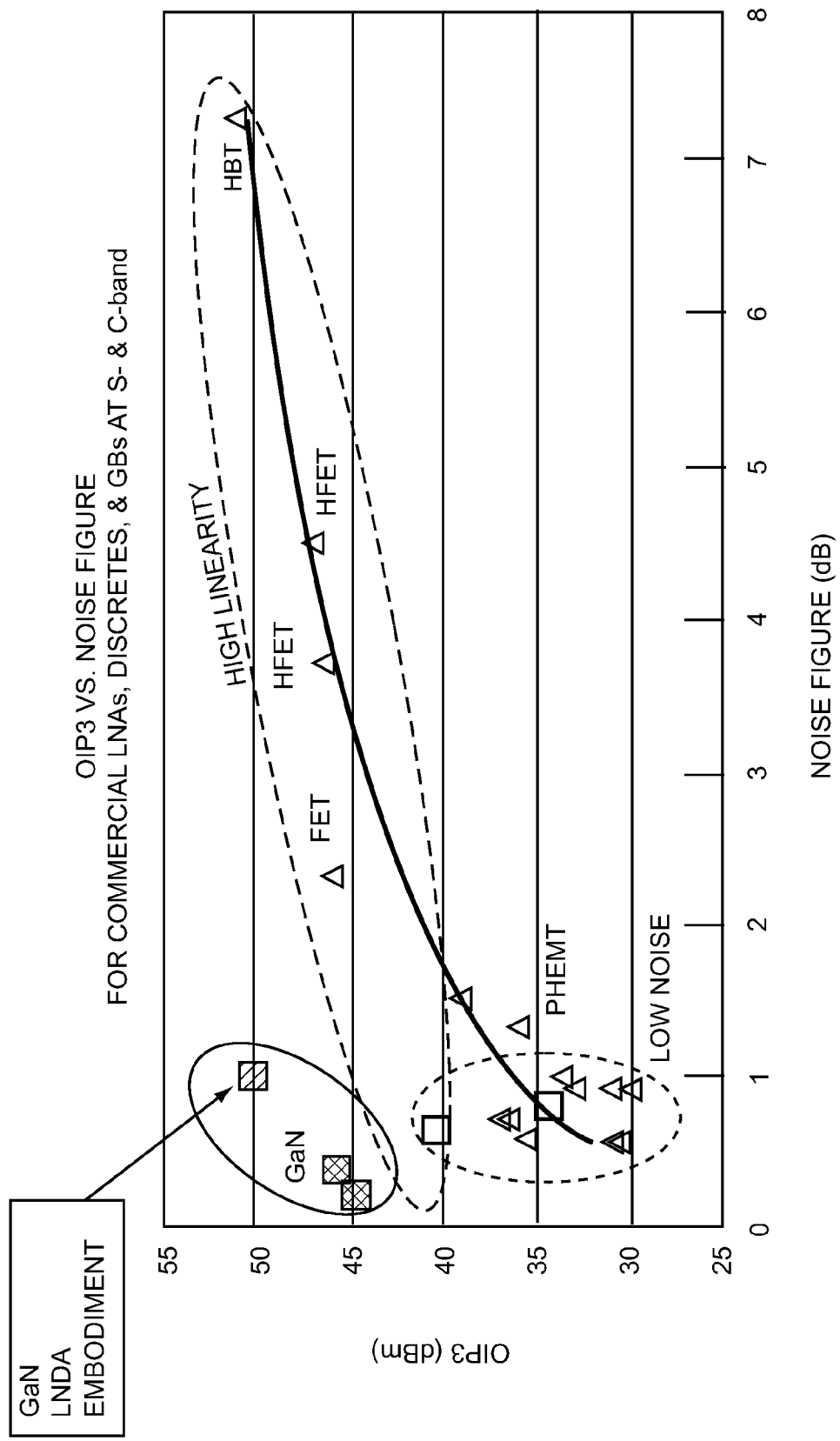
FIG. 9 is a graph that compares OIP3 vs. NF for S- and C-band LNAs based on various technologies.

FIG. 9 is a graph that compares OIP3 vs. NF for S- and C-band LNAs based on various technologies. In particular, FIG. 9 shows an adaptation of the DA 10 that can dramatically improve the state-of-the-art linearity (OIP3) for sub-1 dB noise figure LNA performance. The DA 10 of the present disclosure may be constructed using GaN technology that provides a low noise distributed amplifier (GaN LNDA). In its GaN LNDA form, the DA 10 can increase the OIP3 by >4 dB over lumped element GaN LNA approaches while providing a decade flat-gain bandwidth response that is not achieved by previous GaN LNA benchmark performances. One application for the high dynamic range LNA capability afforded by the present disclosure can enable future software defined communication systems.

Those skilled in the art will recognize improvements and modifications to the preferred embodiments of the present disclosure. All such improvements and modifications are considered within the scope of the concepts disclosed herein and the claims that follow.

What is claimed is:

1. A distributed amplifier (DA) comprising:
   a plurality of amplifier sections, such that each of the plurality of amplifier sections has an input gate and an output drain;
   a first plurality of inductive elements coupled in series between a DA input and a first output to form a first plurality of connection nodes, such that each of the first plurality of connection nodes is coupled to a corresponding adjacent pair of the first plurality of inductive elements;
   a second plurality of inductive elements coupled in series between a first input and a DA output to form a second plurality of connection nodes, such that each of the second plurality of connection nodes is coupled to a corresponding adjacent pair of the second plurality of inductive elements and to a corresponding output drain of the plurality of amplifier sections; and
   an active impedance termination circuit having a termination input coupled to the first output and a termination output coupled to one of the second plurality of connection nodes adjacent to the DA output.

2. The DA of claim 1 wherein respective ones of the first plurality of connection nodes are directly connected only to corresponding ones of the first plurality of inductive elements and a corresponding input gate and respective ones of the second plurality of connection nodes are directly connected only to corresponding ones of the second plurality of inductive elements and the corresponding output drain.

3. The DA of claim 1 wherein the DA input is adapted to receive a first input signal and the DA output is adapted to provide a first output signal based on amplifying the first input signal.

4. The DA of claim 3 wherein:
   the first input signal is a baseband signal;
   the first output signal is an amplified baseband signal; and
   the DA is further adapted to receive a radio frequency (RF) input signal and the DA output is further configured to provide an RF output signal based on amplifying the RF input signal.

5. The DA of claim 3 wherein a frequency of the first input signal is less than about 30 kHz and a frequency of the RF input signal is greater than about 30 GHz.

6. The DA of claim 1 wherein the active impedance termination circuit comprises:
   an amplifier having an amplifier output coupled to the termination output and an amplifier input; and
   an input impedance matching circuit coupled between the termination input and the amplifier input.

7. The DA of claim 1 wherein successive ones of the plurality of amplifier sections comprise tapered active impedance circuits to provide a gradually tapered impedance transition.

8. The DA of claim 7 wherein selected successive ones of the plurality of amplifier sections each include increased feedback.

9. The DA of claim 7 wherein selected successive ones of the plurality of amplifier sections each include transconductance devices with increased gate periphery.

10. The DA of claim 1 wherein the plurality of amplifier sections comprises a plurality of tapered gate periphery transconductance devices, such that:
    each of the plurality of tapered gate periphery transconductance devices comprises the input gate and an input source and has a gate-to-source capacitance between the input gate and the input source; and
    the gate-to-source capacitance of each of the plurality of tapered gate periphery transconductance devices decreases moving from the DA input to the first output.

11. The DA of claim 1 wherein the plurality of amplifier sections comprises a plurality of tapered gate periphery transconductance devices, such that:
    each of the plurality of tapered gate periphery transconductance comprises the input gate and an input source and has a gate-to-source capacitance between the input gate and the input source; and
    the gate-to-source capacitance of each of the plurality of tapered gate periphery transconductance devices increases moving from the DA input to the first output.

12. The DA of claim 11 wherein an output impedance of each of the plurality of tapered gate periphery transconductance devices increases moving from the first input to the DA output to broaden an output power bandwidth of the DA.

13. The DA of claim 1 wherein the plurality of amplifier sections comprises a plurality of tapered gate periphery transconductance devices, such that an output impedance of each of the plurality of tapered gate periphery transconductance devices increases moving from the first input to the DA output to broaden an output power bandwidth of the DA.

14. The DA of claim 1 wherein the plurality of amplifier sections is comprised of gallium nitride (GaN) devices.

15. The DA of claim 1 wherein the plurality of amplifier sections comprises a first plurality of transconductance devices and a second plurality of transconductance devices, such that each of the plurality of amplifier sections is a cascode amplifier sections comprising:
    a corresponding one of the first plurality of transconductance devices comprising:
        the input gate;
        an input source coupled to a common node; and
        an input drain; and
    a corresponding one of the second plurality of transconductance devices comprising:
        an output gate coupled to a common gate direct current (DC) supply;
        an output source coupled to the input drain; and
        the output drain.

16. The DA of claim 15 wherein the first plurality of transconductance devices comprises a first plurality of tapered gate periphery transconductance devices such that:
    each of the first plurality of tapered gate periphery transconductance devices comprises the input gate and the input source and has a gate-to-source capacitance between the input gate and the input source; and the gate-to-source capacitance of each of the first plurality of tapered gate periphery transconductance devices increases moving from the DA input to the first output.

17. The DA of the claim 1 wherein the DA is a GaN low noise distributed power amplifier.

18. A method of making a distributed amplifier (DA) comprising:
providing a plurality of amplifier sections, such that each of the plurality of amplifier sections has an input gate and an output drain;
coupling a first plurality of inductive elements in series between a DA input and a first output to form a first plurality of connection nodes, such that each of the first plurality of connection nodes is coupled to a corresponding adjacent pair of the first plurality of inductive elements;
coupling a second plurality of inductive elements in series between a first input and a DA output to form a second plurality of connection nodes, such that each of the second plurality of connection nodes is coupled to a corresponding adjacent pair of the second plurality of inductive elements and to a corresponding output drain of the plurality of amplifier sections;
providing an active impedance termination circuit having a termination input and a termination output;
coupling the termination input to the first output; and
coupling the termination output to one of the second plurality of connection nodes adjacent to the DA output.

19. The method of claim 18 wherein respective ones of the first plurality of connection nodes are directly connected only to corresponding ones of the first plurality of inductive elements and a corresponding input gate and respective ones of the second plurality of connection nodes are directly connected only to corresponding ones of the second plurality of inductive elements and the corresponding output drain.

20. The method of claim 18 wherein the active impedance termination circuit comprises:
an amplifier having an amplifier output coupled to the termination output and an amplifier input; and
an input impedance matching circuit coupled between the termination input and the amplifier input.

21. The method of claim 18 wherein the plurality of amplifier sections comprises a plurality of tapered gate periphery transconductance devices, such that:
each of the plurality of tapered gate periphery transconductance devices comprises the input gate and an input source and has a gate-to-source capacitance between the input gate and the input source; and
the gate-to-source capacitance of each of the plurality of tapered gate periphery transconductance devices increases moving from the DA input to the first output.

22. The method of claim 21 wherein an output impedance of each of the plurality of tapered gate periphery transconductance devices increases moving from the first input to the DA output to broaden an output power bandwidth of the DA.

23. The method of claim 21 wherein the plurality of amplifier sections comprises a plurality of tapered gate periphery transconductance devices, such that an output impedance of each of the plurality of tapered gate periphery transconductance devices increases moving from the first input to the DA output to broaden an output power bandwidth of the DA.

24. The method of claim 18 wherein the DA input is adapted to receive a first input signal and the DA output is adapted to provide a first output signal based on amplifying the first input signal.

25. The method of claim 24 wherein:
the first input signal is a baseband signal;
the first output signal is an amplified baseband signal; and
the DA is further adapted to receive an RF input signal and the DA output is further configured to provide an RF output signal based on amplifying the RF input signal.

26. The method of claim 18 wherein the plurality of amplifier sections is comprised of GaN devices.

27. The method of claim 18 wherein the plurality of amplifier sections comprises a first plurality of transconductance devices and a second plurality of transconductance devices, such that each of the plurality of amplifier sections is a cascode amplifier sections comprising:
a corresponding one of the first plurality of transconductance devices comprising:
the input gate;
an input source coupled to a common node; and
an input drain; and
a corresponding one of the second plurality of transconductance devices comprising:
an output gate coupled to a common gate direct current (DC) supply;
an output source coupled to the input drain; and
the output drain.

28. The method of claim 27 wherein the first plurality of transconductance devices comprises a first plurality of tapered gate periphery transconductance devices such that:
each of the first plurality of tapered gate periphery transconductance devices comprises the input gate and an input source and has a gate-to-source capacitance between the input gate and the input source; and
the gate-to-source capacitance of each of the first plurality of tapered gate periphery transconductance devices increases moving for the DA input to the first output.

* * * * *